US005724013A

United States Patent [19]
Ishikawa et al.

[11] Patent Number: 5,724,013
[45] Date of Patent: *Mar. 3, 1998

[54] HIGH-FREQUENCY INTEGRATED CIRCUIT

[75] Inventors: Youhei Ishikawa; Toru Tanizaki, both of Kyoto; Hiroshi Nishida, Kawanishi, all of Japan

[73] Assignee: Murata Manufacturing Co., Ltd., Japan

[*] Notice: The term of this patent shall not extend beyond the expiration date of Pat. No. 5,604,469.

[21] Appl. No.: 519,999

[22] Filed: Aug. 28, 1995

[30] Foreign Application Priority Data

Aug. 30, 1994 [JP] Japan .................. 6-205424

[51] Int. Cl.⁶ .................. H01P 5/00; H01P 3/16
[52] U.S. Cl. .................. 333/254; 333/248
[58] Field of Search .................. 333/1.1, 113, 239, 333/248, 254

[56] References Cited

U.S. PATENT DOCUMENTS 4,463,330  7/1984  Yoneyama .................. 333/239
5,473,296  12/1995  Ishikawa et al. .................. 333/239

FOREIGN PATENT DOCUMENTS 587454  3/1994  European Pat. Off. .
507044  7/1994  European Pat. Off. .

OTHER PUBLICATIONS

T. Yoneyama, *Electronic & Communications in Japan, Part II–Electronics*, "Millimeter–wave integrated circuits using nonradiative dielectric waveguide", vol. 74, No. 2, Feb. 1991, pp. 20–28.

T.H. Oxley, et al., *Microwave Journal*, "Image guide and microstrip integrated W–band receivers", vol. 26, No. 11, Nov. 1983, p. 118.

*Primary Examiner*—Paul Gensler
*Attorney, Agent, or Firm*—Ostrolenk, Faber, Gerb & Soffen, LLP

[57]  ABSTRACT

A high-frequency integrated circuit which operates in a microwave band or in a millimeter wave band. The high-frequency integrated circuit has a plurality of devices with respective nonradiative dielectric waveguides such as an oscillator, a coupler, etc., and a substrate on which these devices are surface-mounted. Each of the devices has a pair of parallel conductors, a dielectric strip which is disposed between the conductors and propagates a high-frequency electromagnetic wave, a mounting surface which is formed on one of the conductors and is in contact with the substrate, and an end surface which is defined by an end of the conductors so as to be vertical to a traveling direction of the electromagnetic wave propagated in the dielectric strip and at which an end of the dielectric strip is exposed. The devices with a nonradiative dielectric waveguide are evaluated separately, and thereafter, the devices are surface-mounted on the substrate close to or in contact with one another.

20 Claims, 18 Drawing Sheets

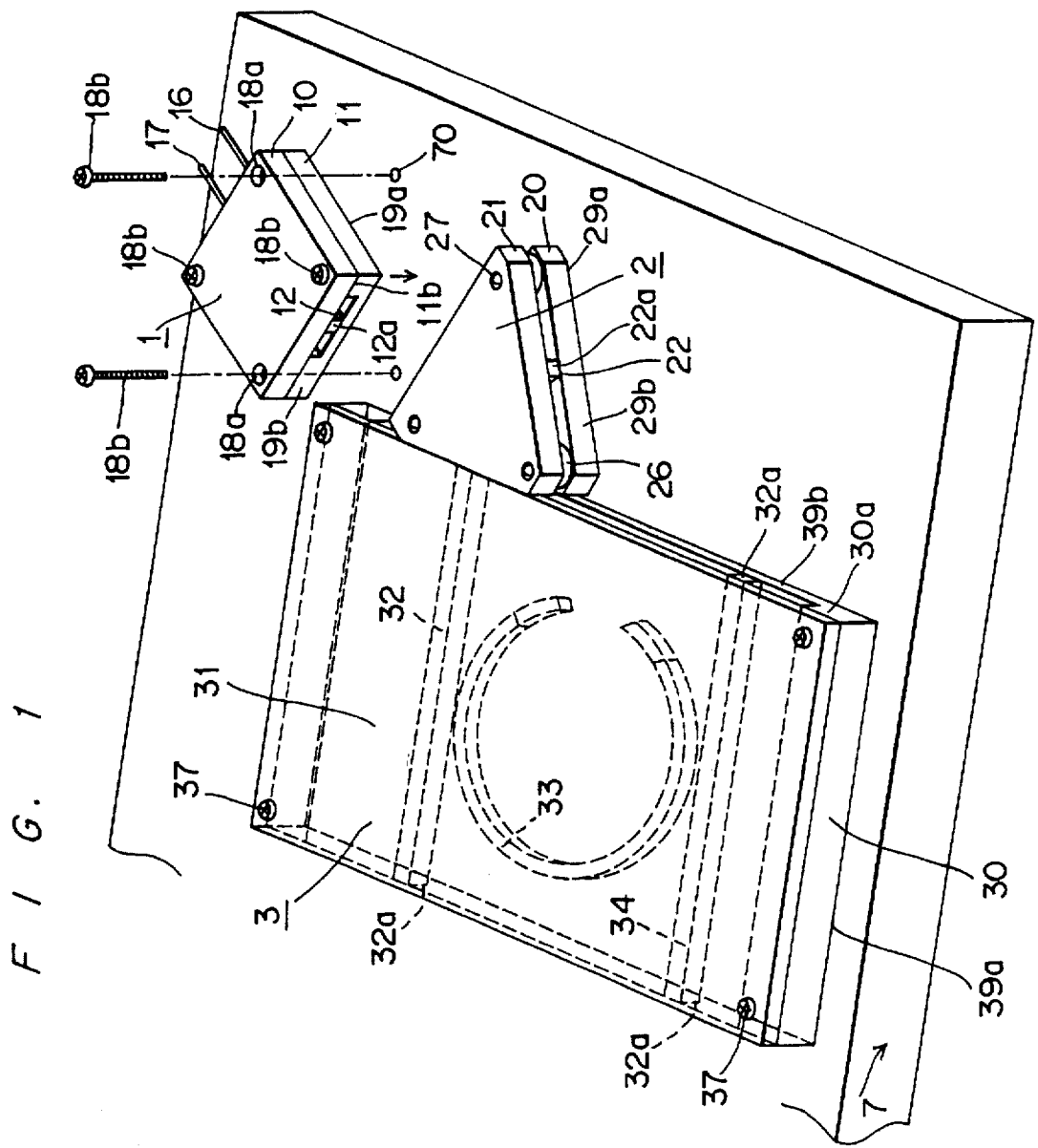

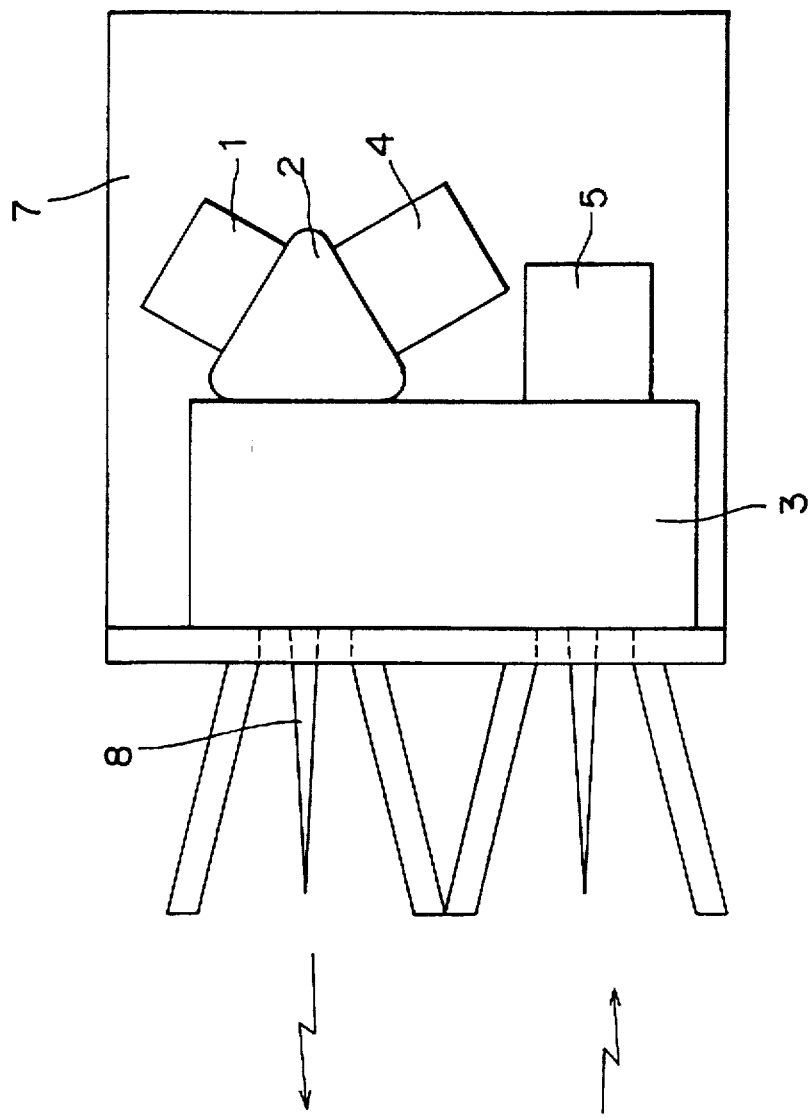

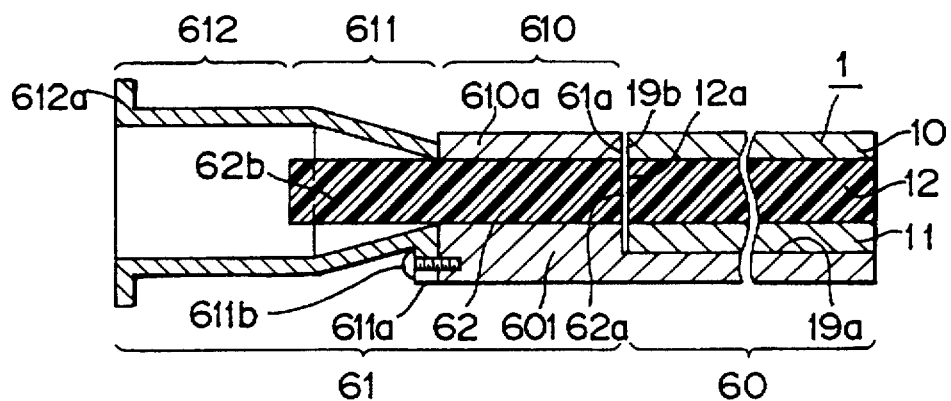
F I G. 3C
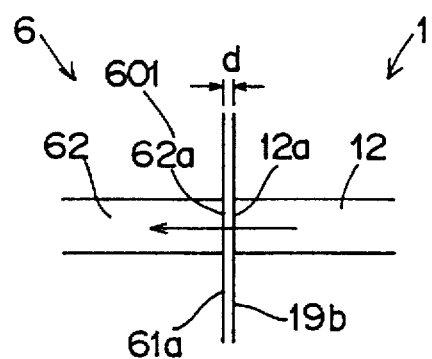
F I G. 4A

F I G. 6A
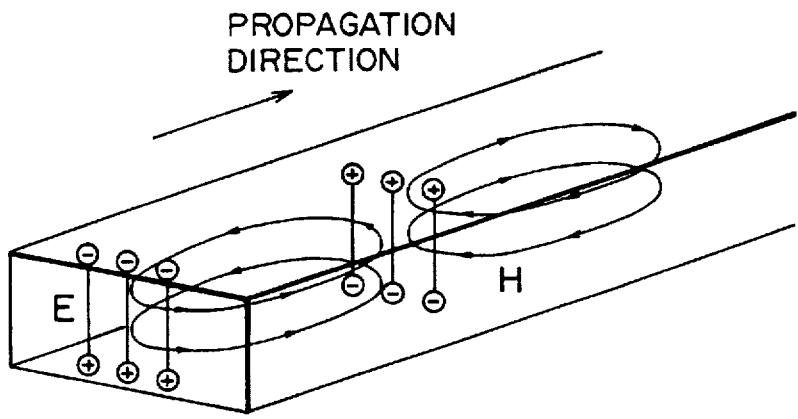
F I G. 6B
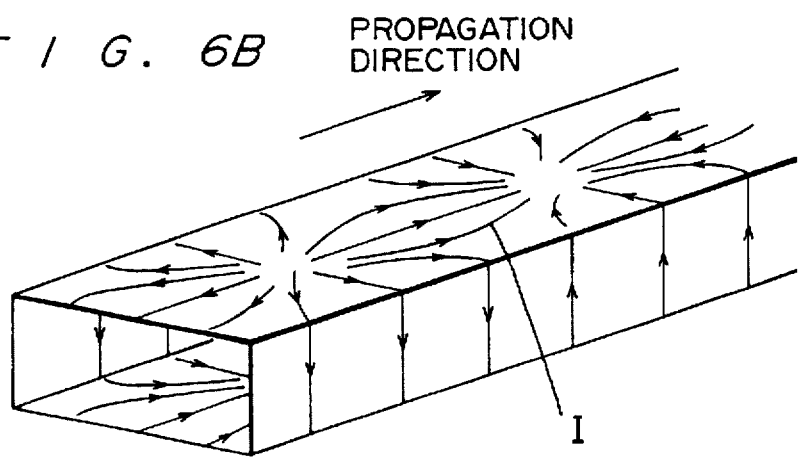

F I G. 14A
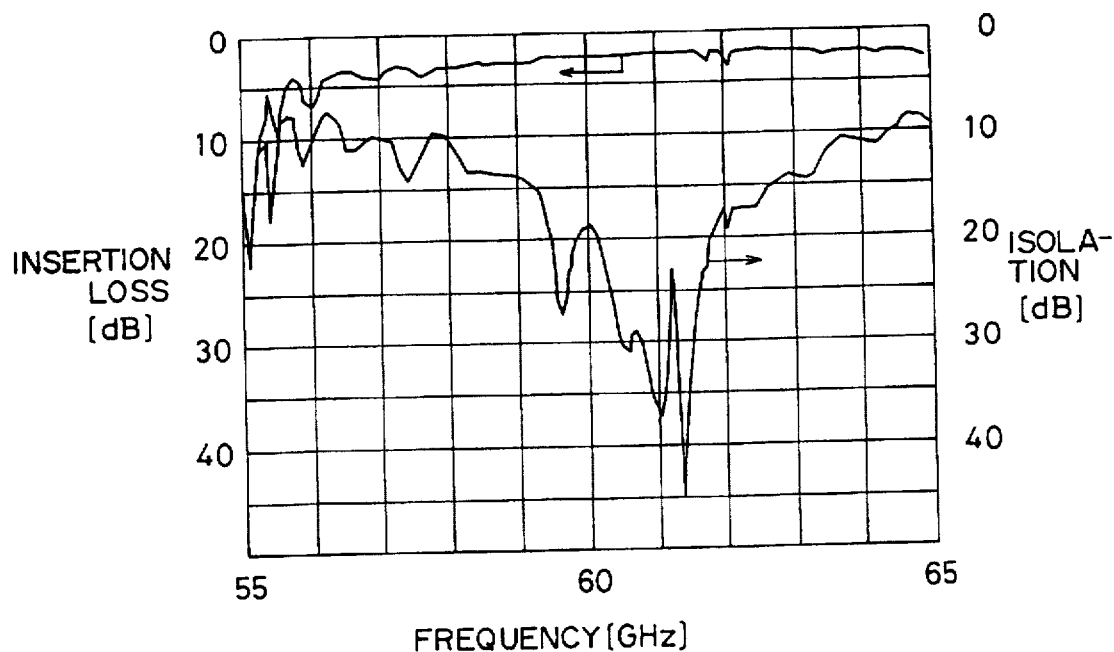
F I G. 14B
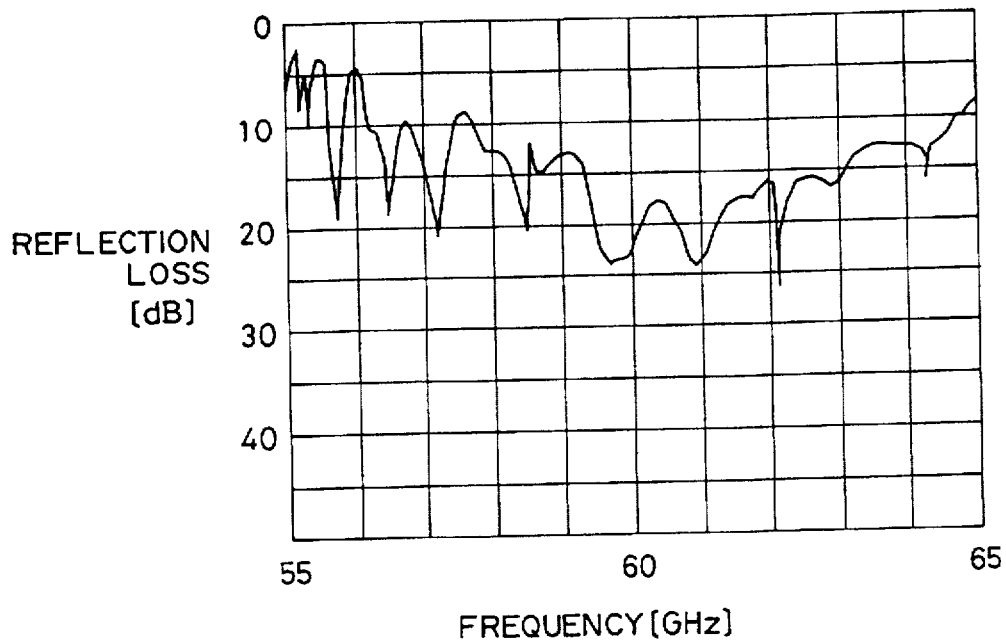

F I G. 15E
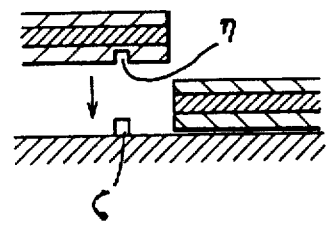
F I G. 15F
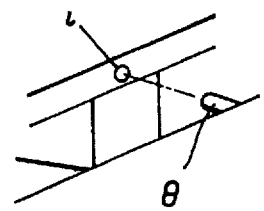
F I G. 16A
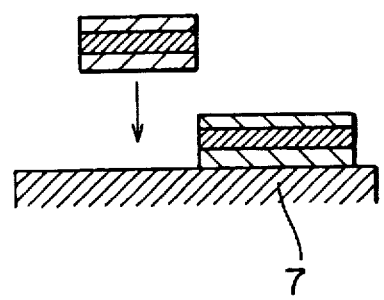
F I G. 16B
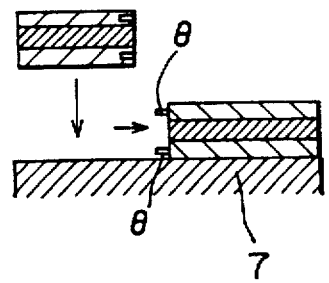

HIGH-FREQUENCY INTEGRATED CIRCUIT

This application is related to commonly assigned U.S. Ser. Nos. 08/519,949 (now U.S. Pat. No. 5,604,469), 08/520,100 (abandoned, and refiled as a continuation having Ser. No. 08/703,806) and 08/520,307 (now U.S. Pat. No. 5,600,289).

BACKGROUND OF THE INVENTION

1. Field of the Invention

The present invention relates to a high-frequency integrated circuit, and more particularly to a high-frequency integrated circuit which has a nonradiative dielectric waveguide and operates in a microwave band or in a millimeter wave band.

2. Description of Related Art

It is well known to arrange dielectric strips between a couple of conductive plates which are parallel to each other at a specified space to form a nonradiative dielectric waveguide which propagates an electromagnetic wave in LSM01 mode or LSE01 mode. For example, if the dielectric strips are designed to be made of a dielectric material with a dielectric constant ($\epsilon$ r) of 2 such as fluororesin and to have a width b of 2.5 mm and a height a of 2.25 mm, the dielectric strips will form a nonradiative dielectric waveguide which propagates an electromagnetic wave in a band of 60 GHz. When these dielectric strips are put between two conductive plates, an electromagnetic wave which has a wavelength more than twice the height is hardly leaks from the dielectric strips. Therefore, an electromagnetic wave in LSM01 mode or in LSE01 mode is propagated along the dielectric strips without radiating, that is, with a small loss. Thus, such a nonradiative dielectric waveguide is suited to be used as a transmission line of a microwave or a millimeter wave.

Since it is possible to provide magnetic parts and semiconductor chips as well as dielectric strips between a couple of conductive plates, a circulator, an oscillator and the like which have a nonradiative dielectric waveguide can be formed. In this way, a high-frequency integrated circuit which operates in a microwave band or in a millimeter wave band can be produced.

In producing such a high-frequency integrated circuit, first, evaluation is conventionally carried out. For example, in producing an FM-CW radar, dielectric strips, magnetic parts and semiconductor chips are arranged between a couple of conductive plates for evaluation to form a circulator, an oscillator and so on. The conductive plates are connected to an evaluation terminal, and the characteristics of the whole circuit which is composed of the circulator, the oscillator, etc. are measured. Then, the dielectric strips, the magnetic parts and the semiconductor chips are dismounted from the conductive plates for evaluation, and these parts are then rearranged between another couple of conductive plates to produce an integrated circuit.

However, in this method, it is difficult to rearrange the circulator, the oscillator, etc. in the same way to reproduce an integrated circuit with the characteristics as measured. In this method, also, it is impossible to evaluate and adjust the circulator, the oscillator, etc. individually. Therefore, the mass productivity of the integrated circuit is not good. Further, when the integrated circuit develops a defect, and a part of the integrated circuit, for example, the circulator or the oscillator is exchanged, the change of the part may influence the whole circuit.

SUMMARY OF THE INVENTION

An object of the present invention is to provide a high-frequency integrated circuit and components thereof which are suited for mass production.

In order to attain the object, a high-frequency integrated circuit according to the present invention has a substrate and a plurality of devices with a nonradiative dielectric waveguide. Each of the devices comprises a couple of conductors which are parallel to each other at a specified space; a dielectric strip which is disposed between the couple of conductors; a plane mounting surface which is formed on one of the conductors and is entirely in contact with the substrate; and an end surface which is formed on an end of the conductors and is vertical to a direction in which an electromagnetic wave is propagated in the dielectric strip, an end of the dielectric strip being exposed on the end surface.

The devices with a nonradiative dielectric waveguide can be produced and evaluated separately. After the evaluation, the devices are mounted on the substrate one by one. Further, if necessary, the devices can be dismounted from the substrate separately.

BRIEF DESCRIPTION OF THE DRAWINGS

This and other objects and features of the present invention will be apparent from the following description with reference to the accompanying drawings, in which:

FIG. 1 is a perspective view of a high-frequency integrated circuit in the course of assembly which is an embodiment of the present invention;

FIG. 2 is a plan view of the assembled high-frequency integrated circuit;

FIG. 3C is a sectional view of the measuring jig and the oscillator, taken along a line IIIC—IIIC in FIG. 3B;

FIG. 4A is an internal plan view of a connecting portion between a dielectric strip of the oscillator and a dielectric strip of the measuring jig;

FIG. 6A is a distribution chart which shows an electric field and a magnetic field of an electromagnetic wave which is propagated in a metal tubular waveguide in TE10 mode;

FIG. 6B is a distribution chart which shows a surface current of the electromagnetic wave which is propagated in the metal tubular waveguide in TE10 mode;

FIG. 14A is a graph which shows an insertion loss characteristic and an isolation characteristic of the circulator;

FIG. 14B is a graph which shows a reflection loss characteristic of the circulator;

FIG. 15E is a sectional view of devices with a nonradiative dielectric waveguide which shows another method of positioning the devices on a substrate;

FIG. 15F is a partial enlarged perspective view of devices with a nonradiative dielectric waveguide which shows another method of positioning the devices on a substrate;

FIG. 16A is a sectional view of devices with a nonradiative dielectric waveguide which shows movement of one of the devices for mounting on a substrate;

FIG. 16B is a sectional view of devices with a nonradiative dielectric waveguide which shows movement of one of the devices for mounting on a substrate.

DETAILED DESCRIPTION OF THE PREFERRED EMBODIMENTS

Figure 3A:
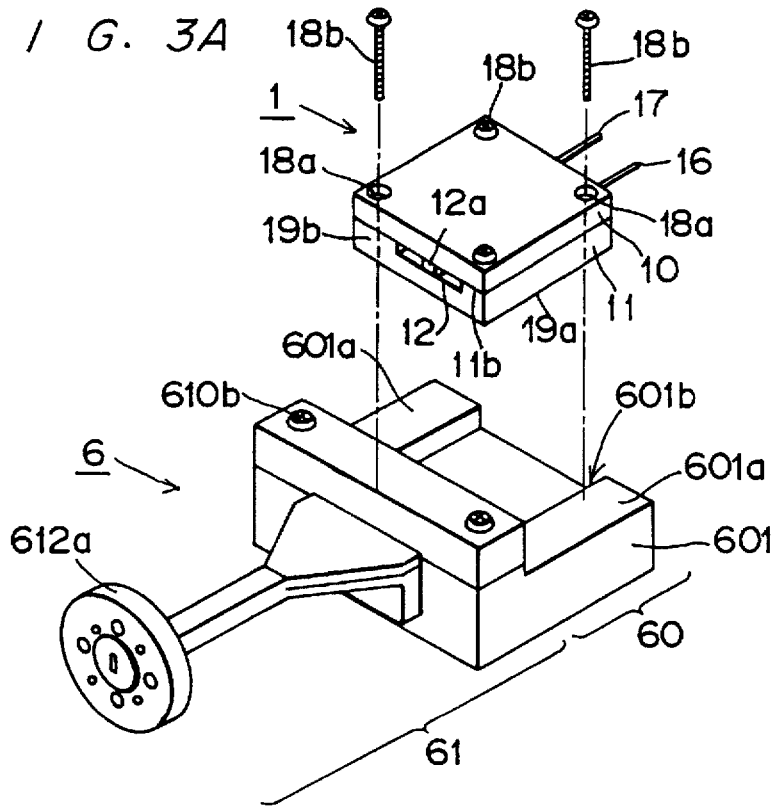
FIG. 3A is a perspective view of a measuring jig for evaluating an oscillator of the integrated circuit.

A high-frequency integrated circuit which is an embodiment of the present invention is described with reference to the accompanying drawings.

The high-frequency integrated circuit is used, for example, as a high frequency section of an FM-CW radar which operates in a millimeter wave band. As shown in FIGS. 1 and 2, the high-frequency integrated circuit comprises devices with a nonradiative dielectric waveguide, namely, an oscillator 1, a circulator 2, a coupler 3, a nonreflective terminal 4 and a mixer 5. Further, the high-frequency integrated circuit has a substrate 7 on which these devices are surface-mounted close to or in contact with one another. The substrate 7 is an insulating plate, a conductive plate or an insulating plate with a metallized surface.

The oscillator 1 comprises a couple of rectangular conductive plates 10 and 11, a dielectric strip 12 and semiconductor chips (not shown) which are disposed between the conductive plates 10 and 11, a power terminal 16 and a modulating terminal 17. The conductive plates 10 and 11 are made of a conductive material such as aluminum, copper and the like. The conductive plate 11 has spacers 11b for keeping the space from the conductive plate 10 at a specified height a. The dielectric strip 12, as an example, is made of a dielectric material with a dielectric constant ($\epsilon$ r) of 2 such as fluororesin, and is designed to have a height a of 2.25 mm and a width b of 2.5 mm. The conductive plates 10 and 11 have tapped holes 18a at the respective four corners. By tightening screws 18b into the tapped holes 18a, the dielectric strip 12 and the semiconductor chips are fixed between the conductive plates 10 and 11.

The conductive plate 11 has a plane mounting surface 19a on the lower side. The laminated conductive plates 10 and 11 have an end surface 19b on which an end 12a of the dielectric strip 12 shows, and the end surface 19b is vertical to a direction in which a high-frequency electromagnetic wave travels. The oscillator 1 outputs an electromagnetic wave to the circulator 2 through the end 12a of the dielectric strip 12. The substrate 7 has tapped holes 70, and the oscillator 1 is fixed on the substrate 7 by the screws 18b.

The circulator 2 comprises a couple of triangular conductive plates 20 and 21, and three dielectric strips 22 (although only one dielectric strip is seen in FIG. 1) and magnetic parts (not shown) which are disposed between the conductive plates 20 and 21. The conductive plates are made of a conductive material such as aluminum, copper and the like. Between the conductive plates 20 and 21, spacers 26 for keeping the space therebetween at the height a are provided at the three corners. Tapped holes (not shown) are made in the conductive plates 20 and 21 at the respective three corners such that the tapped holes communicate with the spacers 26. By tightening screws 27 into the tapped holes, the dielectric strips 22 and the magnetic parts are fixed between the conductive plates 20 and 21. Also, the circulator 2 is fixed on the substrate 7 by the screws 27.

The conductive plate 20 has a plane mounting surface 29a on the lower side. On the three end surfaces 29b of the laminated conductive plates 20 and 21, respective ends 22a of the dielectric strips 22 show, and the end surfaces 29b are vertical to directions in which a high-frequency electromagnetic wave which is inputted or outputted through the ends 22a of the dielectric strips 22 travels.

The coupler 3 comprises a couple of rectangular conductive plates 30 and 31, and three dielectric strips 32, 33 and 34 which are disposed between the conductive plates 30 and 31. The conductive plates 30 and 31 are made of a conductive material such as aluminum, copper and the like. The conductive plate 30 has spacers 30a for keeping the space from the conductive plate 31 at the height a. The conductive plates 30 and 31 have tapped holes (not shown) at the respective four corners. By tightening screws 37 into the tapped holes, the dielectric strips 32, 33 and 34 are fixed between the conductive plates 30 and 31. Also, the coupler 3 is fixed on the substrate 7 by the screws 37.

The conductive plate 30 has a plane mounting surface 39a on the lower side. The laminated conductive plates 30 and 31 have two opposite end surfaces 39b on which respective ends 32a of the dielectric strips 32 and 34 show, and the end surfaces 39b are vertical to directions in which a high-frequency electromagnetic wave inputted or outputted through the ends 32a travels.

The nonreflective terminal 4 and the mixer 5 (shown in FIG. 2) have basically the same type of structure as the oscillator 1, the circulator 2 and the coupler 3. Each of these devices comprises a couple of conductive plates and a dielectric strip, and has a plane mounting surface and an end surface on which an end of the dielectric strip shows. These are fixed on the substrate 7 by screws.

Figure 3B:
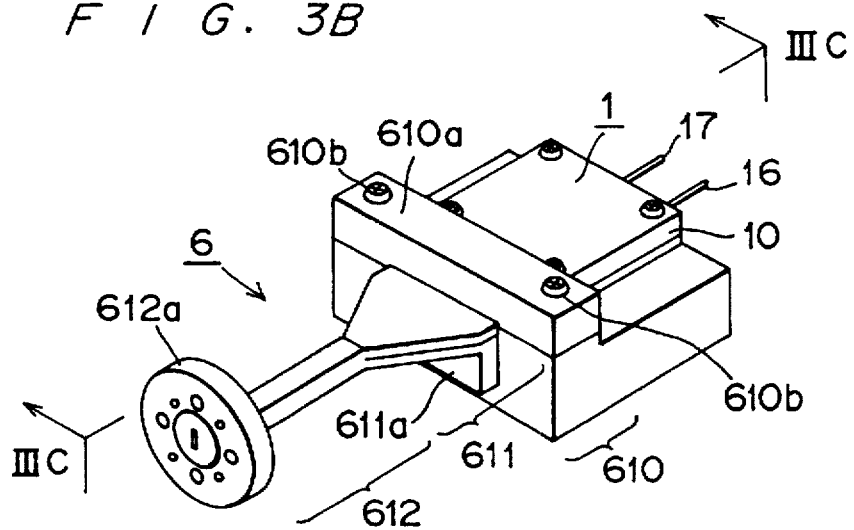
FIG. 3B is a perspective view of the measuring jig and the oscillator mounted therein.

FIGS. 3A, 3B and 3C show a jig 6 for measuring the characteristics of the oscillator 1. The jig 6 comprises a mount section 60 and a converting section 61. The mount section 60 is formed in a part of a base plate 601 which is made of a conductive material such as aluminum, copper and the like. The base plate 601 has a couple of side walls 601a for positioning the oscillator 1. The base plate 601 further has tapped holes 601b, and when the oscillator 1 is mounted in the mount section 60 with the mounting surface 19a on the base plate 601, the tapped holes 18a of the oscillator 1 communicate with the tapped holes 601b of the base plate 601. Therefore, the oscillator 1 can be fixed on the base plate 601 by the screws 18b.

The converting section 61 is to connect the oscillator 1 to a transmission line, for example, a metal tubular waveguide. The converting section 61 comprises a pressing section 610, a dielectric strip 62, a horn 611 and a metal tubular waveguide 612. In the pressing section 610, the dielectric strip 62 is partly fixed between the base plate 601 and a pressing plate 610a by screws 610b. The horn 611 is fixed to the pressing section 610 by joining a flange 611a thereof to the pressing section 610 by a screw 611b. The waveguide 612 has a flange 612a on its end.

On the side of the converting section 61 which faces the oscillator 1, an end surface 61a on which an end 62a of the dielectric strip 62 shows is formed, and the end surface 61a is vertical to a direction in which an electromagnetic wave is propagated in the dielectric strip 62. The other end 62b of the dielectric strip 62 is tapered in the width way such that the characteristic impedance of the dielectric strip 62 will match the characteristic impedance of the transmission line to which the metal tubular waveguide 612 is connected.

Figure 4B:
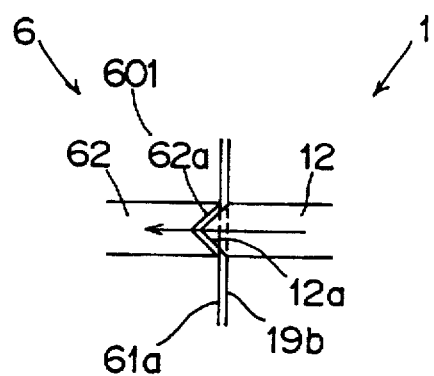
FIG. 4B is an internal plan view of a modification of the connecting portion between the dielectric strip of the oscillator and the dielectric strip of the measuring jig.
Figure 4C:
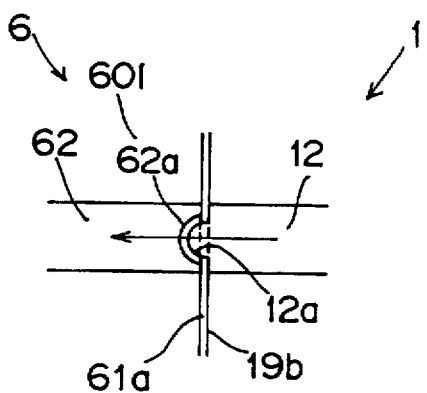
FIG. 4C is an internal plan view of another modification of the connecting portion between the dielectric strip of the oscillator and the dielectric strip of the measuring jig.

FIG. 4A is a plan view of a connecting portion between the dielectric strip 12 of the oscillator 1 and the dielectric strip 62 of the measuring jig 6, that is, the exposed end 12a of the dielectric strip 12 and the exposed end 62a of the dielectric strip 62. The ends 12a and 62a of the dielectric strips 12 and 62 are vertical to a direction in which an electromagnetic wave is propagated and are on a level with the end surface 19b of the oscillator 1 and the end surface 61a of the pressing section 610, respectively. The ends 12a and 62a are in contact with each other. The connection between the dielectric strips 12 and 62 is possible in other ways as illustrated in FIGS. 4B and 4C.

In FIG. 4B, the ends 12a and 62a of the dielectric strips 12 and 62 are wedges which engage with each other. The end 12a is slightly protruded from the end surface 19b of the oscillator 1. In FIG. 4C, the ends 12a and 62a of the dielectric strips 12 and 62 are round which engage with each other, and the end 12a is slightly protruded from the end surface 19b of the oscillator 1. As in the cases of FIGS. 4B and 4C, the ends 12a and 62a of the dielectric strips 12 and 62 do not have to be vertical to the electromagnetic wave propagation direction as long as the ends 12a and 62a engage with each other. It is also possible that the ends 12a and 62a which are vertical to the electromagnetic wave propagation direction are slightly protruded from the respective end surfaces 19b and 61a and are put into contact with each other.

Next, the action of the oscillator 1 is described. When a direct current is supplied to the power terminal 16 of the oscillator 1, a high-frequency electromagnetic wave is generated and inputted into the dielectric strip 12. Suppose that the space between the conductive plates 10 and 11 is a and the generated electromagnetic wave has a wavelength of $\lambda$. If a $< \lambda/2$, the electromagnetic wave which is propagated in a parallel direction to the conductive plates 10 and 11 does not leak from the dielectric strip 12. The electromagnetic wave is propagated in the dielectric strip 12 and is outputted through the end 12a. When the oscillator 1 is mounted in the measuring jig 6, the oscillator 1 acts in the same way, and the electromagnetic wave is outputted through the end 12a in the pressing section 610. Possible transmission modes of an electromagnetic wave in a nonradiative dielectric waveguide are generally LSE mode and LSM mode. In order for a small loss, LSM01 mode which is the lowest mode of LSM mode is usually used.

Figure 5:
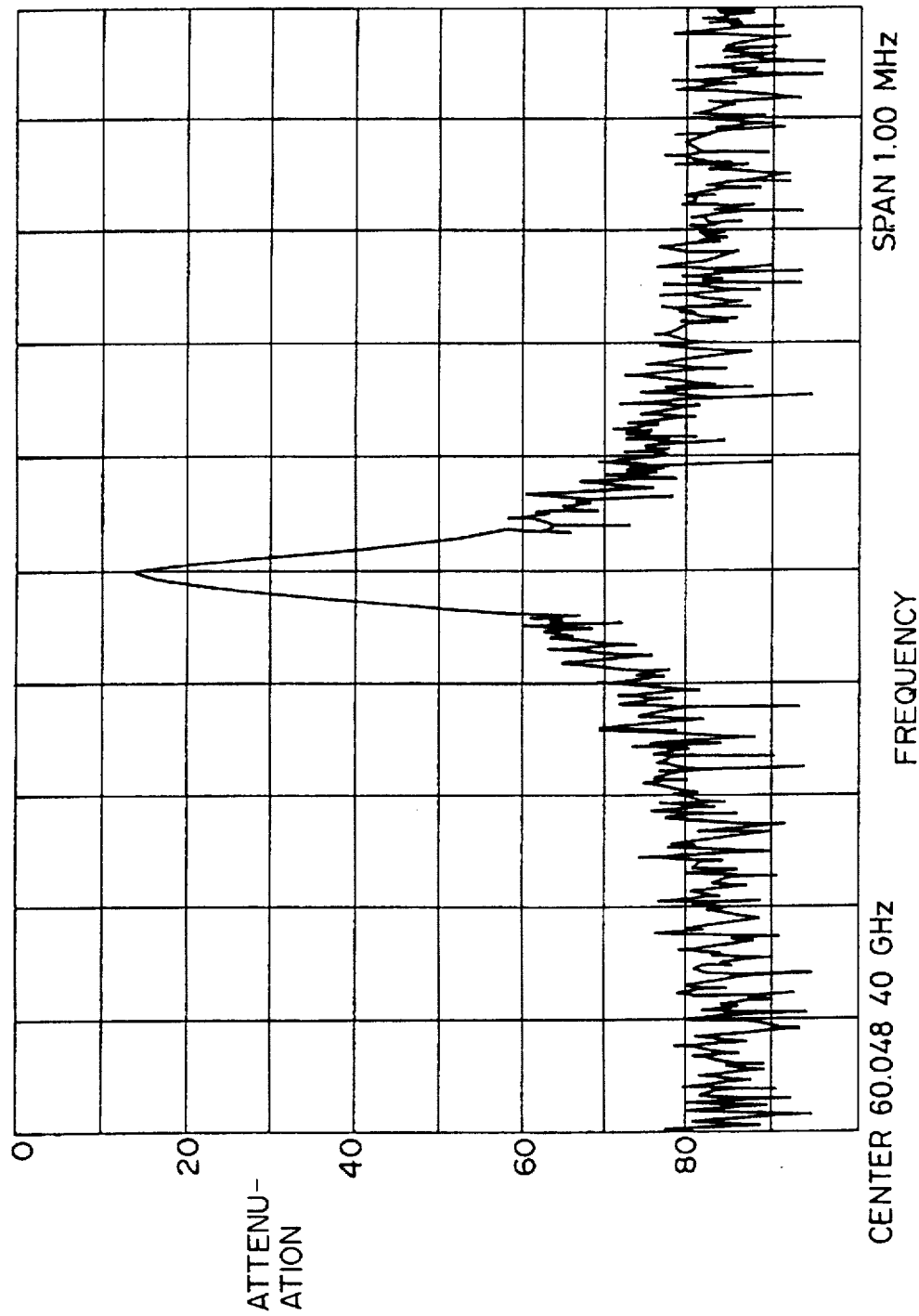
FIG. 5 is a graph which shows an oscillation characteristic of the oscillator.

The inventors evaluated the oscillator 1 by using the measuring jig 6 and a spectrum analyzer. FIG. 5 is a graph showing the oscillation characteristic of the oscillator 1. As is apparent from the graph of FIG. 5, an oscillation signal which has a resonance frequency of about 60 GHz and has a good waveform was outputted from the end 12a of the dielectric strip 12.

Figure 7A:
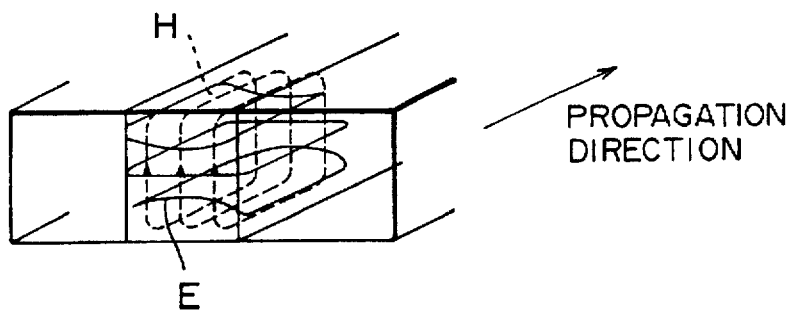
FIG. 7A is a distribution chart which shows an electric field and a magnetic field of an electromagnetic wave which is propagated in a nonradiative dielectric waveguide in LSM01 mode.
Figure 7B:
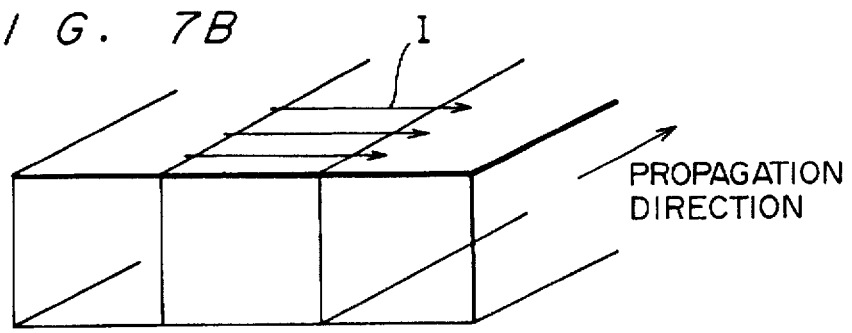
FIG. 7B is a distribution chart which shows a surface current of the electromagnetic wave which is propagated in the nonradiative dielectric waveguide in LSM01 mode.
Figure 7C:
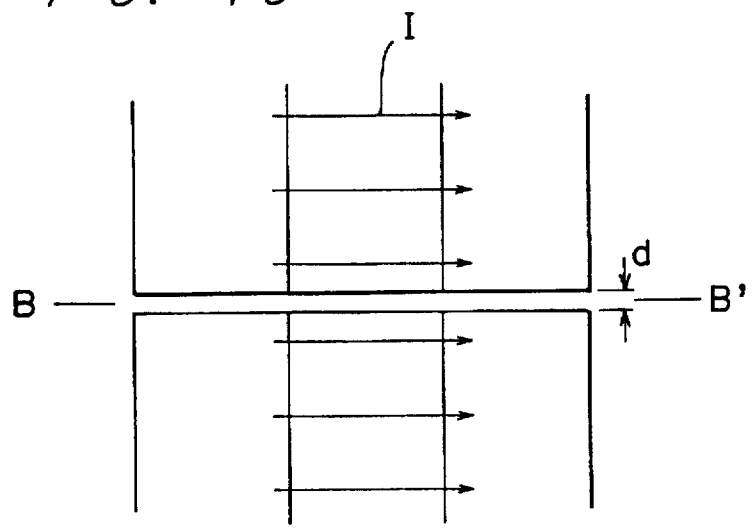
FIG. 7C is a plane distribution chart which shows the surface current of the electromagnetic wave when the nonradiative dielectric waveguide is cut off at a line B–B'.

Now, the difference between an electromagnetic wave propagated in a metal tubular waveguide and an electromagnetic wave propagated in a nonradiative dielectric waveguide is described. FIGS. 6A and 6B show an electromagnetic wave propagated in a metal tubular waveguide in TE10 mode. FIG. 6A shows the electric field E and the magnetic field H of the electromagnetic wave, and FIG. 6B shows the surface current I. FIGS. 7A, 7B and 7C show an electromagnetic wave propagated in a nonradiative dielectric waveguide in LSM01 mode. FIG. 7A shows the electric field E and the magnetic field H of the electromagnetic wave, and FIGS. 7B and 7C show the surface current I. FIG. 7C shows a state wherein the nonradiative dielectric waveguide is cut off at a line B–B'.

As is apparent from FIG. 6B, the surface current I of an electromagnetic wave propagated in a metal tubular waveguide has a component in the electromagnetic wave propagation direction. Therefore, in connecting the metal tubular waveguide to another metal tubular waveguide, the waveguides must be joined firmly without space by a flange. Otherwise, the surface current I will not flow from one of the waveguides to the other waveguide.

On the other hand, the surface current I of an electromagnetic wave propagated in a nonradiative dielectric waveguide in LSM01 mode, as is apparent from FIG. 7B, has only a component in a direction perpendicular to the electromagnetic wave propagation direction. Therefore, even if the conductive plates and the dielectric strip of the nonradiative dielectric waveguide are cut off perpendicularly to the electromagnetic wave propagation direction, that is, even if the nonradiative dielectric waveguide has a gap, the gap will not influence transmission of the electromagnetic wave.

Figure 8A:
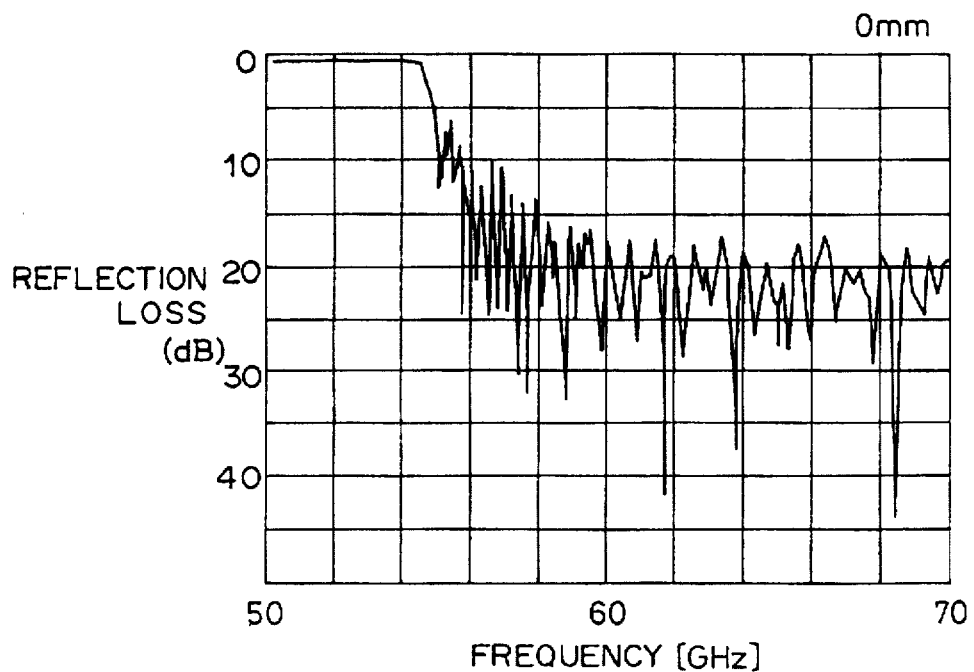
FIG. 8A is a graph which shows a reflection loss characteristic of the oscillator when the conductive plates and the dielectric strip have a gap of 0.
Figure 8B:
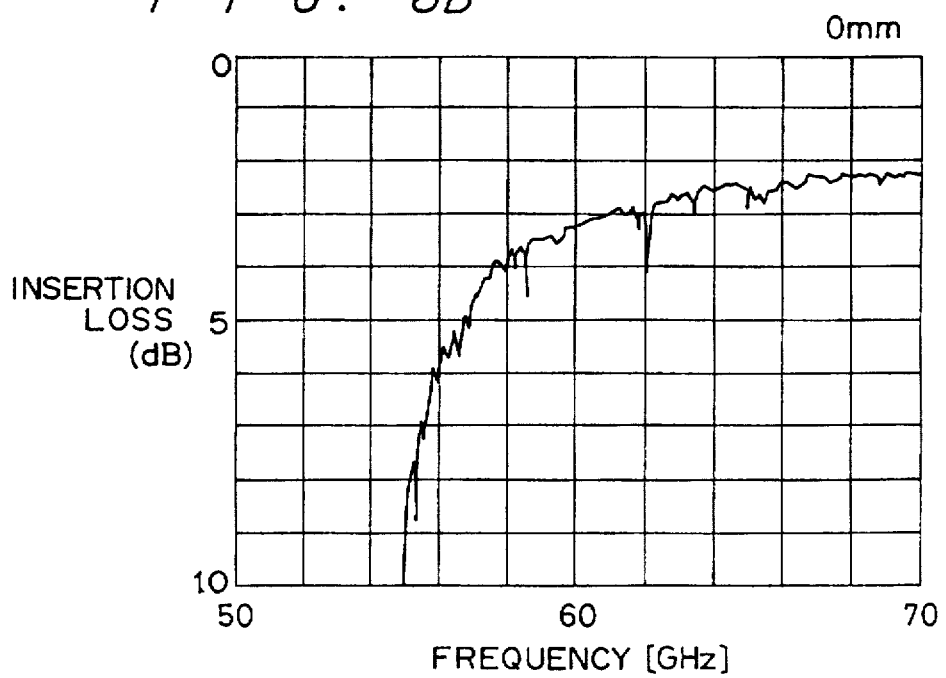
FIG. 8B is a graph which shows an insertion loss characteristic of the oscillator when the conductive plates and the dielectric strip have a gap of 0.
Figure 9A:
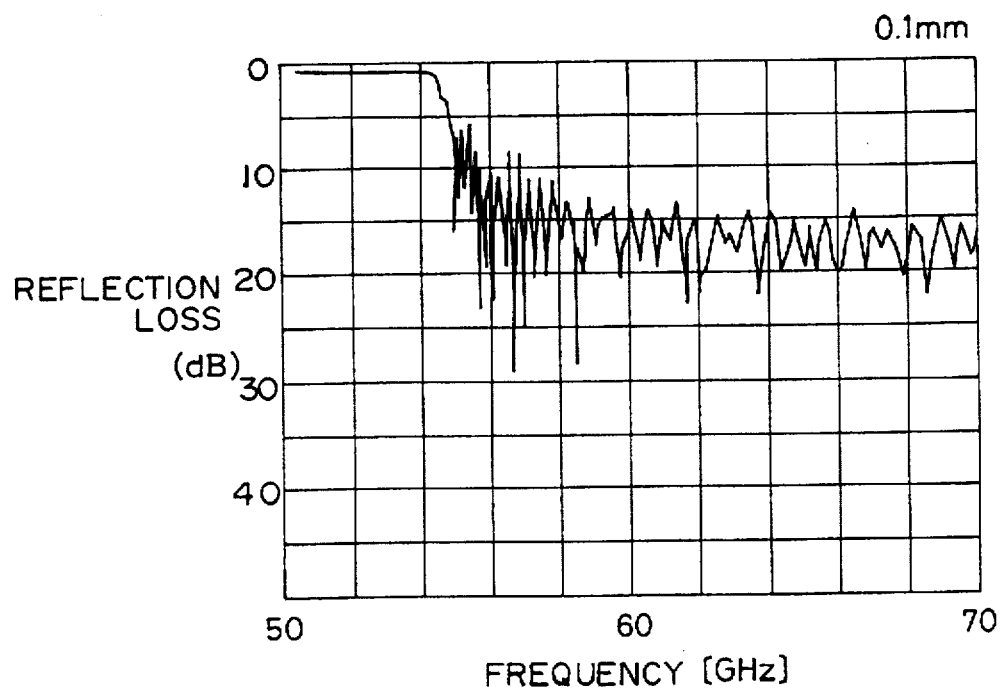
FIG. 9A is a graph which shows a reflection loss characteristic of the oscillator when the conductive plates and the dielectric strip have a gap of 0.1 mm.
Figure 9B:
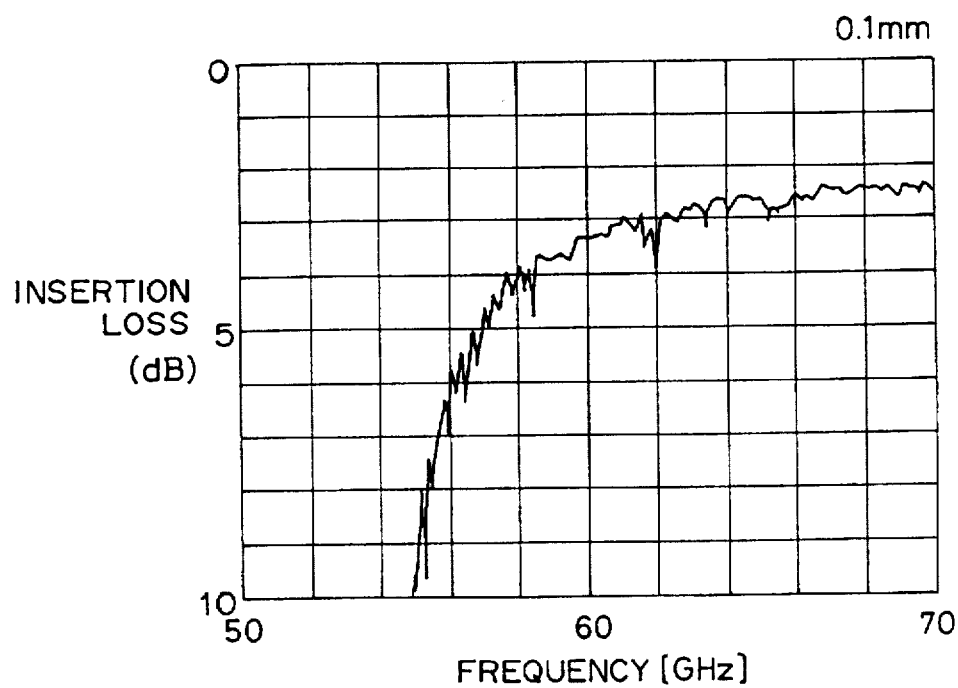
FIG. 9B is a graph which shows an insertion loss characteristic of the oscillator when the conductive plates and the dielectric strip have a gap of 0.1 mm.

In order to prove this assumption, the inventors measured the characteristics of the oscillator 1 when the conductive plates 10 and 11 and the dielectric strip 12 were cut off to have a gap d in a direction perpendicular to the electromagnetic wave propagation direction. FIGS. 8A and 8B show the characteristics when the gap d was 0. FIGS. 9A and 9B show the characteristics when the gap d was 0.1 mm. As is apparent from FIGS. 8A through 9B, the reflection loss and the insertion loss of the oscillator 1 were only a little increased when the oscillator 1 had a gap of 0.1 mm.

Now, this is applied to the connection between the dielectric strip 12 of the oscillator 1 and the dielectric strip 62 of the measuring jig 6. The case of FIGS. 8A and 8B corresponds to a case wherein the end surface 19b of the oscillator 1 and the end 12a of the dielectric strip 12 are in contact with the end surface 61a of the pressing section 610 and the end 62a of the strip 62, respectively (d=0 in FIG. 4A). The case of FIGS. 9A and 9B corresponds to a case wherein there is a gap d of 0.1 mm between the level of the end surface 19b and the end 12a and the level of the end surface 61a and the end 62a (d=0.1 mm in FIG. 4A). From the result of the experiment, it can be inferred that a slight gap between the end 12a and the end 62a is allowable. Accordingly, the connection between the oscillator 1 and the measuring jig 6 does not require firm joining by use of a flange, and pushing between the end 12a of the dielectric strip 12 and the end 62a of the dielectric strip 62 is not necessary. Therefore, only by mounting the oscillator 1 in the mount section 60 of the measuring jig 6 with the mounting surface 19b of the oscillator 1 on the base plate 601, an electromagnetic wave is propagated in the dielectric strips 12 and 62 in LSM01 mode without mismatching and with a small loss. Thus, the characteristics of the oscillator 1 can be measured accurately in a simple way.

Further, in order to estimate the characteristics in a case wherein the end 12a of the dielectric strip 12 and the end 62a of the dielectric strip 62 which are slightly protruded from the end surfaces 19b and 61a respectively are put into contact with each other, the inventors conducted an experiment in the following way. The conductive plates 10 and 11 and the dielectric strip 12 were cut off perpendicularly to the electromagnetic wave propagation direction. Then, the cut ends of the dielectric strip 12 were put into contact again, while the conductive plates 10 and 11 were rearranged to have a gap d between the respective cut ends. In this state, the characteristics of the oscillator 1 were measured.

Figure 10A:
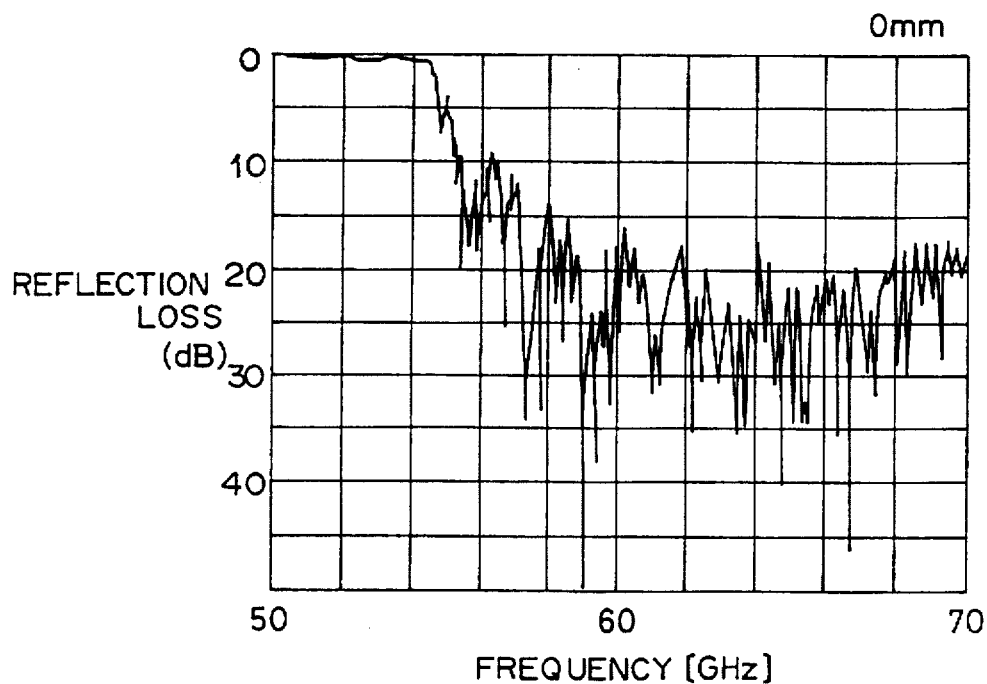
FIG. 10A is a graph which shows a reflection characteristic of the oscillator when the conductive plates and the dielectric strip have a gap of 0.
Figure 10B:
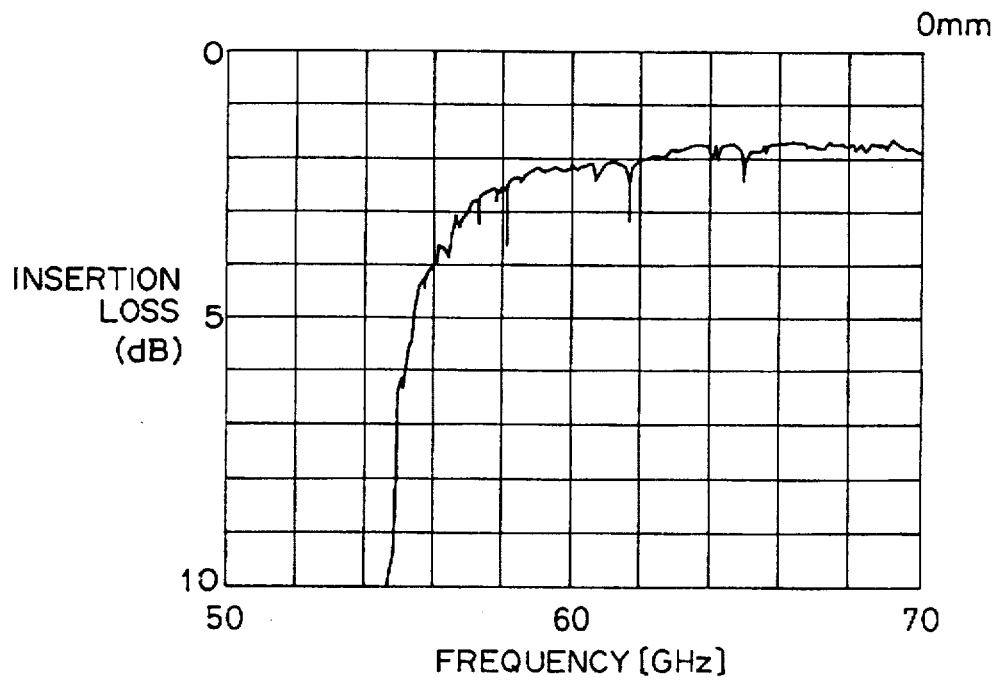
FIG. 10B is a graph which shows an insertion loss characteristic of the oscillator when the conductive plates and the dielectric strip have a gap of 0.
Figure 11A:
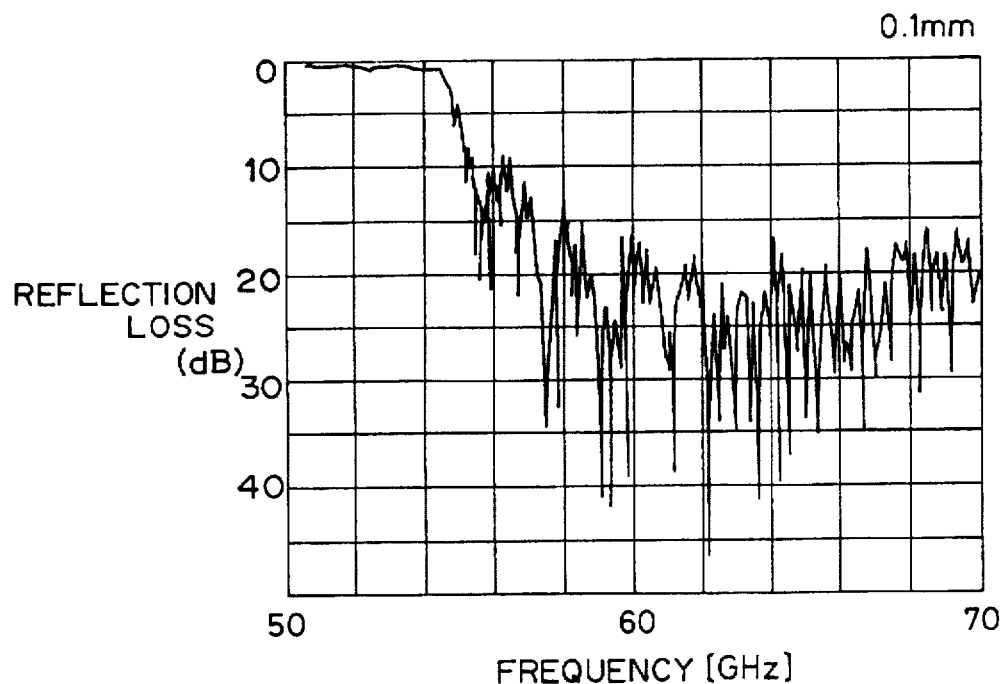
FIG. 11A is a graph which shows a reflection loss characteristic of the oscillator when only the conductive plates have a gap of 0.1 mm.
Figure 11B:
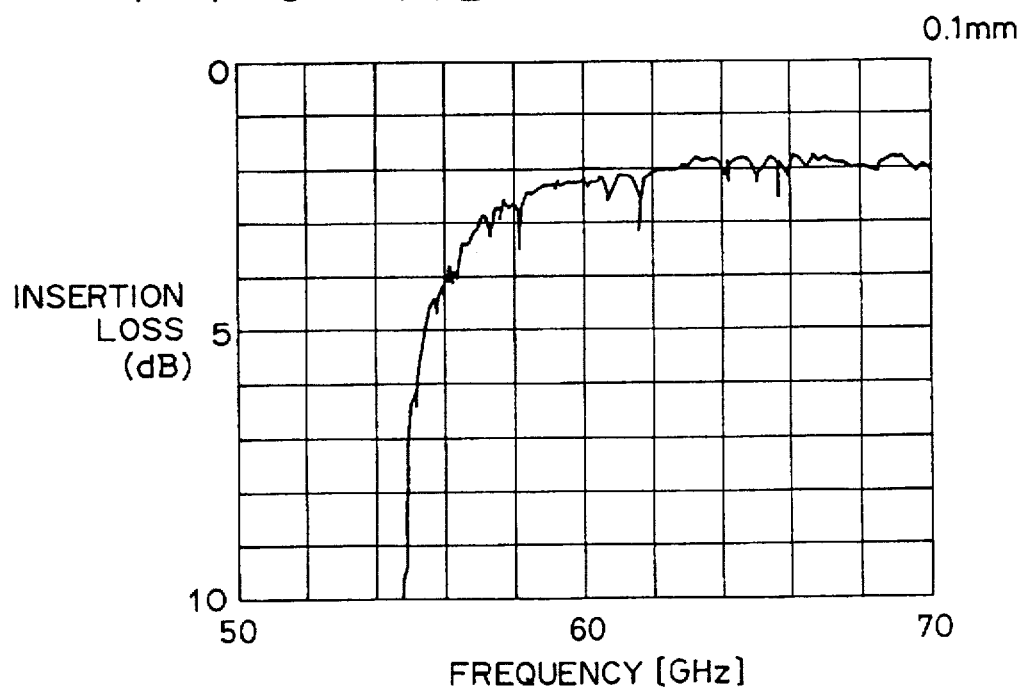
FIG. 11B is a graph which shows an insertion loss characteristic of the oscillator when only the conductive plates have a gap of 0.1 mm.
Figure 12A:
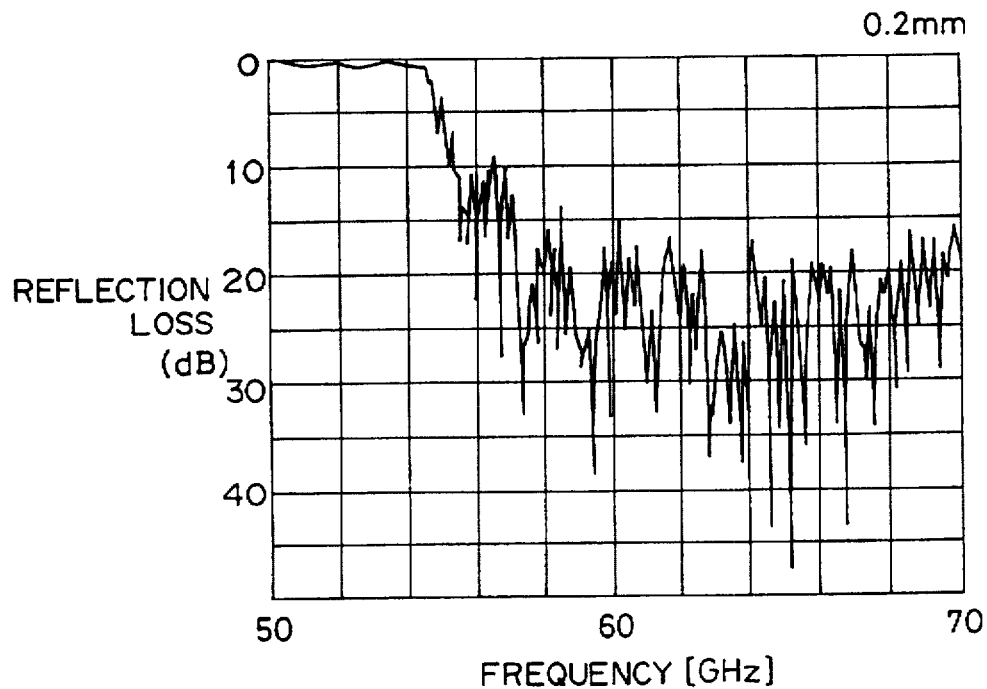
FIG. 12A is a graph which shows a reflection loss characteristic of the oscillator when only the conductive plates have a gap of 0.2 mm.
Figure 12B:
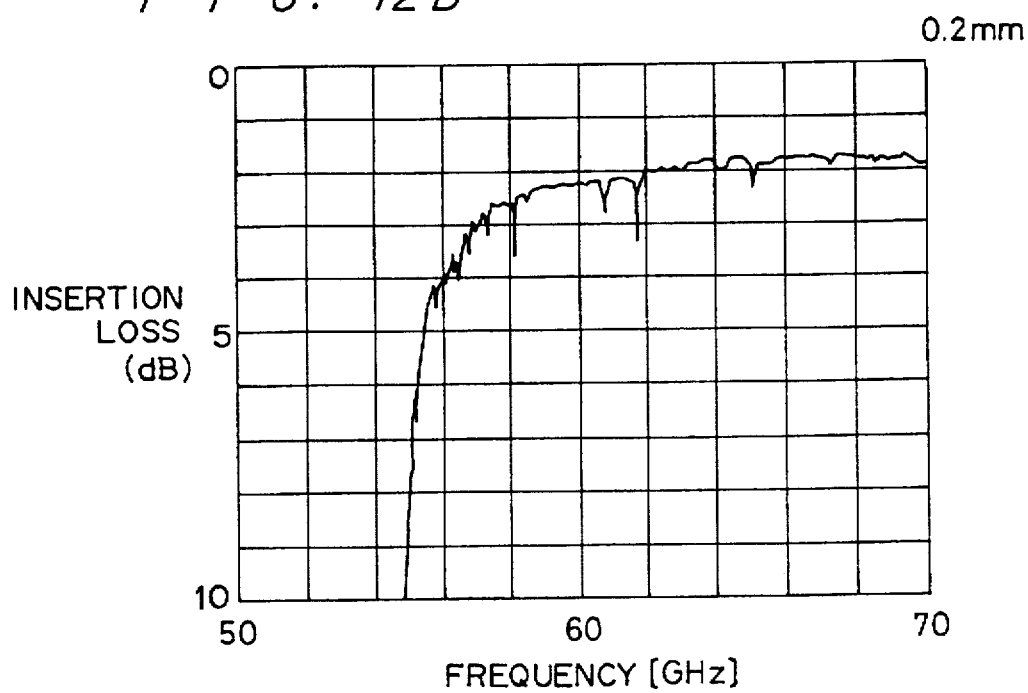
FIG. 12B is a graph which shows an insertion loss characteristic of the oscillator when only the conductive plates have a gap of 0.2 mm.

FIGS. 10A and 10B show the characteristics when the gap d was 0, and more specifically when the cut ends of the dielectric strip 12 and the cut ends of the conductive plates 10 and 11 were joined again. FIGS. 11A and 11B show the characteristics when the gap d was 0.1 mm, and more specifically when the cut ends of the dielectric strip 12 were protruded from the respective cut ends of the conductive plates 10 and 11 by 0.05 mm and were put into contact with each other. FIGS. 12A and 12B show the characteristics when the gap d was 0.2 mm, and more specifically when the cut ends of the dielectric strip 12 were protruded from the respective cut ends of the conductive plates 10 and 11 by 0.1 mm and were put into contact with each other.

As is apparent from FIGS. 10A through 12B, even if there is a gap d between the conductive plates 10 and 11, the reflection loss and the insertion loss of the oscillator 1 hardly change as long as the cut ends of the dielectric strip 12 are in contact with each other. This is applicable to the connection between the oscillator 1 and the measuring jig 6. Therefore, even if the end 12a of the strip 12 and the end 62a of the strip 62 are slightly protruded from the respective end surfaces 19b and 61a, as long as the ends 12a and 62a are in contact with each other, the reflection loss and the insertion loss will hardly change.

Figure 13:
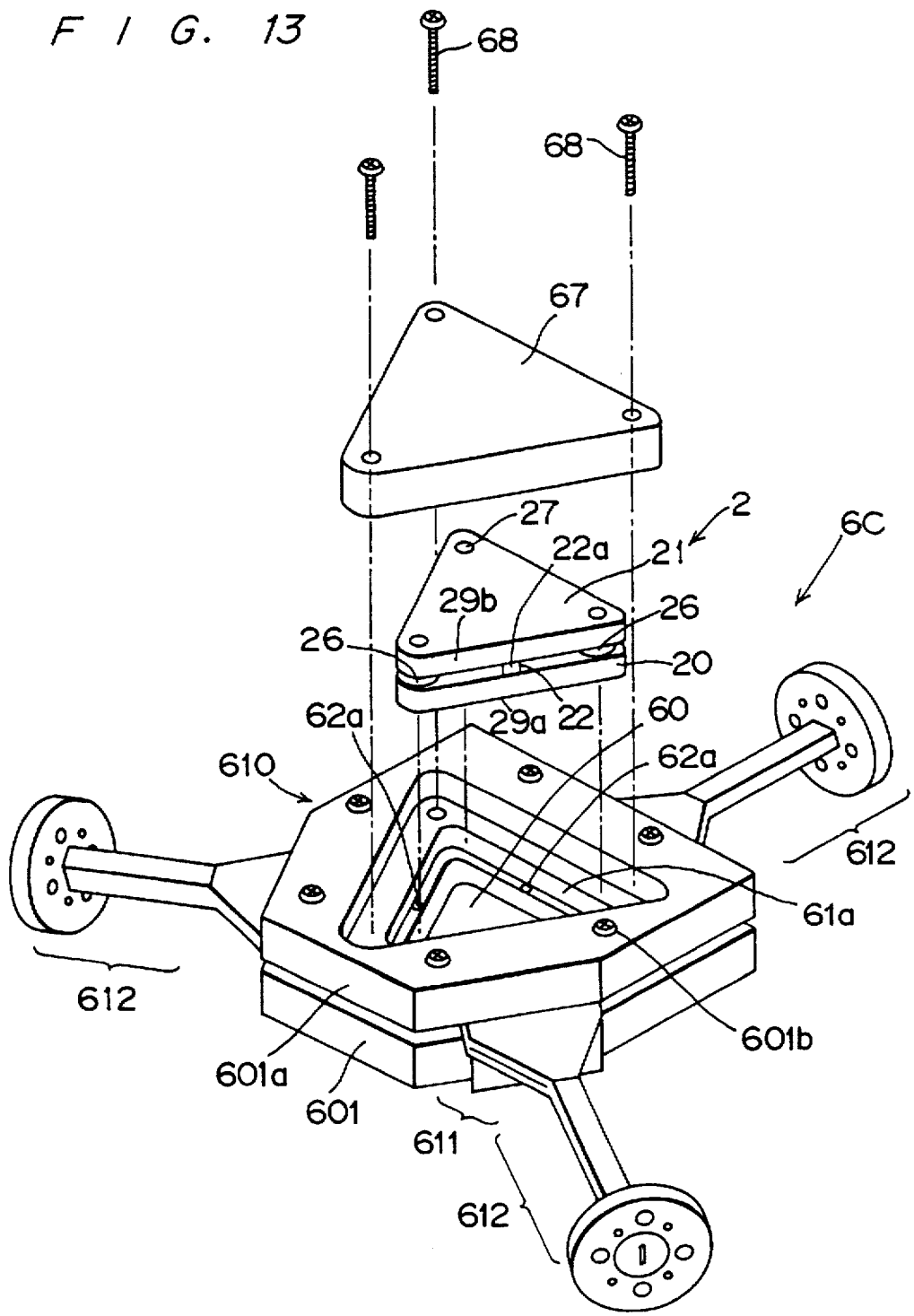
FIG. 13 is a perspective view of a measuring jig for evaluating a circulator of the integrated circuit of FIG. 1.
Figure 15A:
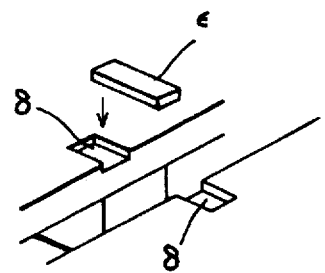
FIG. 15A is a partial enlarged perspective view of devices with a nonradiative dielectric waveguide which shows a method of positioning the devices on a substrate.
Figure 15B:
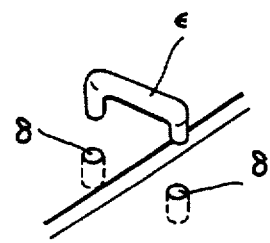
FIG. 15B is a partial enlarged perspective view of devices with a nonradiative dielectric waveguide which shows another method of positioning the devices on a substrate.
Figure 15C:
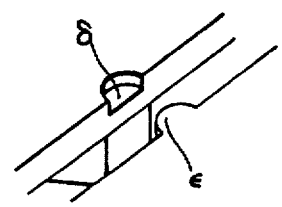
FIG. 15C is a partial enlarged perspective view of devices with a nonradiative dielectric waveguide which shows another method of positioning the devices on a substrate.
Figure 15D:
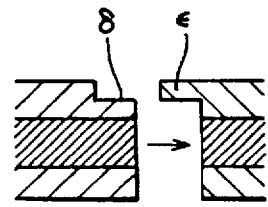
FIG. 15D is a sectional view of FIG. 15C.

FIG. 13 shows the general structure of a measuring jig 6C for measuring the characteristics of the circulator 2. In FIG. 13, the same parts and members which are used for the measuring jig 6 are provided with the same reference symbols, and the description of these parts and members is omitted. Since the circulator 2 has three exposed ends 22a of the dielectric strips 22, that is, three ports, the measuring jig 6C has a structure which is a combination of three measuring jigs 6. The circulator 2 is placed in a mount section 60 of the measuring jig 6C guided by three vertical surfaces 61a. In this moment, if even one of the screws 27 comes off the circulator 2, the dielectric strips 22 may be out of position. In order to prevent this trouble, a lid 67 is put on the circulator 2, and the circulator 2 is fixed in the measuring jig 6C by screws 68. In this state, the characteristics of the circulator 2 are measured.

When a high-frequency electromagnetic wave is inputted into the circulator 2 through one of the three ports (one of the ends 22a of the strips 22), the electromagnetic wave is propagated only to a specified one of the other two ports. The inventors evaluated the circulator 2 by using the measuring jig 6C and a network analyzer. The evaluation was carried out while the circulator 2 is used as an isolator with one of the ends 22a of the dielectric strips 22 serving as a nonreflective terminal.

FIGS. 14A and 14B show the results of the evaluation. As is apparent from FIGS. 14A and 14B, the circulator 2 has a good isolation characteristic, a good insertion loss characteristic and a good reflection loss characteristic.

In this way, the characteristics of the circulator 2 can be measured only by setting and screwing the circulator 2 in the measuring jig 6C. The connection between the circulator 2 and the measuring jig 6C does not require firm joining by use of a flange, and pushing between the ends 22a of the dielectric strips 22 and the ends 62a of the dielectric strips 62 is not necessary. When the circulator 2 is fixed in the measuring jig 6C with the mounting surface 29a of the circulator 2 on the mount section 60, an electromagnetic wave is propagated to a specified one of the dielectric strips 62 through the dielectric strips 22 in LSM01 mode without mismatching and with a small loss. Thus, by using the measuring jig 6C, the characteristics of the circulator 2 can be measured accurately in a simple way.

A measuring jig for a coupler 3 should be structured as a combination of four measuring jigs 6. Since the nonreflective terminal 4 and the mixer 5 are a one-port type, the measuring jig 6 can be used for evaluation of these devices. If the results of the evaluation of all the devices 1 through 5 are good, these devices 1 through 5 are surface-mounted on the substrate 7 close to or in contact with one another.

Since the devices 1 through 5 are surface-mounted on the substrate 7 close to or in contact with one another as shown in FIGS. 1 and 2, there is no fear that the surface mounting on the substrate 7 will change the characteristics of the devices 1 through 5, and the devices 1 through 5 can perform the characteristics as measured in the evaluation by use of the measuring jigs 6 and 6C. Consequently, the produced integrated circuit is good in productivity and reliability.

In this way, various devices with a nonradiative dielectric waveguide can be produced individually, and mass production of these devices is possible. Also, these devices as produced can be evaluated separately by using the measuring jigs. Since the devices can be surface-mounted on a substrate to perform the characteristics as measured and are detachable from the substrate separately, an integrated circuit which is suited for mass production can be obtained.

Although in FIG. 1, the devices 1 through 5 are screwed on the substrate 7, it is possible to use solder or conductive paste to fix the devices 1 through 5 on the substrate 7. By providing an antenna 8 to the substrate 7 as illustrated in FIG. 2, a radar head is produced.

The following four methods are possible for positioning of the devices 1 through 5 on the substrate 7.

(1) Grooves are made on the substrate 7, and the devices 1 through 5 are mounted on the substrate 7 guided by the grooves.

(2) As illustrated in FIGS. 15A through 15D, a recess δ is made on an upper surface of one or both of adjacent devices, and by engaging a positioning member ε with the recess δ, the devices are positioned.

(3) As illustrated in FIG. 15E, guide pins ζ are provided on the substrate 7, and holes η are provided on the respective mounting surfaces of the devices, and by engaging the guide pins ζ with the holes η, the devices are positioned. The guide pins ζ and the holes η0 can be provided on the devices and on the substrate 7, respectively.

(4) As illustrated in FIG. 15F, a guide pin θ and a hole ι are provided on the respective end surfaces of adjacent devices which are to face each other, and by engaging the guide pin θ with the hole ι, the devices are positioned.

Mounting of the devices adopting one of the methods (1) through (3), as shown in FIG. 16A, requires only vertical movement of the devices. On the other hand, mounting of the devices adopting the method (4), as shown in FIG. 16B, requires horizontal movement of the devices as well as vertical movement thereof. Therefore, the methods (1) through (3) are more practical than the method (4).

Figure 17:
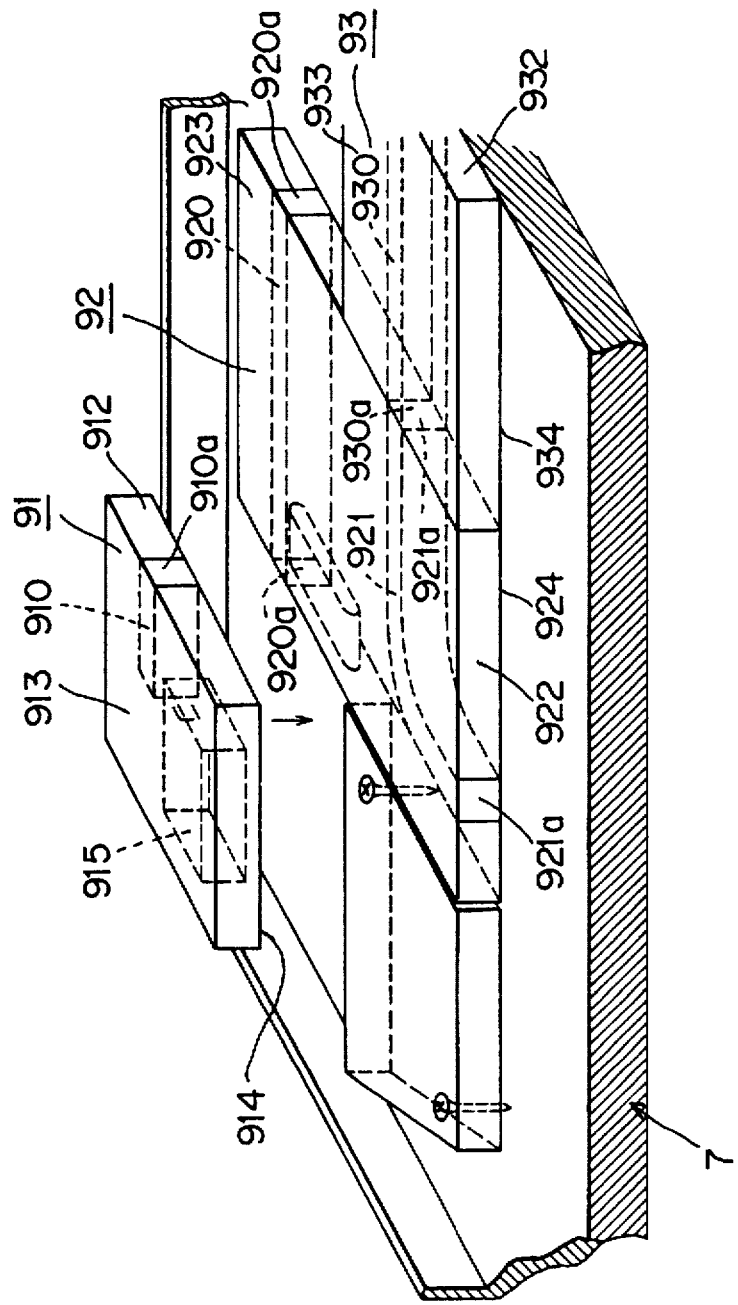
FIG. 17 is a partial perspective view of a high-frequency integrated circuit which is another embodiment of the present invention.

FIG. 17 shows a part of a high-frequency integrated circuit which is another embodiment of the present invention. The same parts and members which are used in the embodiment of FIG. 1 are provided with the same reference symbols, and the description of these parts and members is omitted. In FIG. 17, numerals 91, 92 and 93 denote devices with a nonradiative dielectric waveguide. The device 91 comprises a dielectric strip 910, a rectangular parallelepiped dielectric block containing a filling 912, and the dielectric block has conductive surfaces 913 and 914 on the upper and lower sides. Likewise, the device 92 comprises dielectric strips 920 and 921, and a rectangular parallelepiped dielectric block which contains a filling 922 and has conductive surfaces 923 and 924 on the upper and lower sides. The device 93 comprises a dielectric strip 930, and a rectangular parallelepiped dielectric block which contains a filling 932 and has conductive surfaces 933 and 934 on the upper and lower sides. The dielectric strips 910, 920, 921 and 930 have ends 910a, 920a, 921a and 930a, respectively, which are exposed on the end surfaces of the respective dielectric blocks. Further, the device 91 also has an active element 915 between the conductive surfaces 913 and 914.

The dielectric strips 910, 920, 921 and 930 are made of ceramic with a high dielectric constant. The fillings 912, 922 and 932 are made of ceramic with a low dielectric constant. The conductive surfaces 913, 914, 923, 924 933 and 934 are formed by metallizing the upper and lower sides of the respective dielectric blocks.

The characteristics of the devices 91, 92 and 93 are measured by measuring jigs, and thereafter, the devices 91, 92 and 93 are surface-mounted on a substrate 7 being close or connected to one another to form an integrated circuit. If If the substrate 7 is an insulating material, the devices 91, 92 and 93 are fixed thereon by screws. If the substrate 7 is a conductive material or has a metallized surface, the devices 91, 92 and 93 may be fixed thereon by solder or conductive paste.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A high-frequency integrated circuit comprising:
   a substrate;
   a plurality of devices, each having a nonradiative dielectric waveguide, which are surface-mounted on the substrate, each of the devices comprising:
      a respective pair of conductors which are parallel to each other with a specified spacing therebetween; and
      a respective dielectric strip which is disposed between the corresponding pair of conductors;
      one of the conductors having a plane mounting surface which is entirely in contact with the substrate; and
      the pair of conductors defining an end surface which is vertical with respect to a direction in which an electromagnetic wave is propagated in the dielectric strip, an end of the dielectric strip being exposed at the end surface; and
      the exposed end of the dielectric strip of each of the devices being close to an exposed end of a respective dielectric strip of an adjacent one of said devices so as to propagate said electromagnetic wave between said devices.

2. A high-frequency integrated circuit as claimed in claim 1, wherein the exposed end of the dielectric strip has a projection which is protruded from the end surface of the conductors.

3. A high-frequency integrated circuit as claimed in claim 1, wherein the exposed end of the dielectric strip has a recess which is retracted from the end surface of the conductors.

4. A high-frequency integrated circuit as claimed in claim 1, wherein at least one of the devices with a nonradiative dielectric waveguide is an oscillator.

5. A high-frequency integrated circuit as claimed in claim 1, wherein at least one of the devices with a nonradiative dielectric waveguide is a circulator.

6. A high-frequency integrated circuit as claimed in claim 1, wherein at least one of the devices with a nonradiative dielectric waveguide is a coupler which further has another dielectric strip which is also disposed between the pair of conductors and is coupled to said first-mentioned dielectric strip.

7. A high-frequency integrated circuit as claimed in claim 1, wherein at least one of the devices with a nonradiative dielectric waveguide is a nonreflective terminal.

8. A high-frequency integrated circuit as claimed in claim 1, wherein at least one of the devices with a nonradiative dielectric waveguide is a mixer.

9. A high-frequency integrated circuit as claimed in claim 1, wherein each of the devices with a nonradiative dielectric waveguide further comprises a filling material with a low dielectric constant between the pair of conductors.

10. A high-frequency integrated circuit as claimed in claim 1, further comprising an antenna provided to the substrate.

11. A high-frequency integrated circuit comprising:

a substrate;

a plurality of devices, each having a nonradiative dielectric waveguide, which are surface-mounted on the substrate, each of the devices comprising:

a respective pair of conductors which are parallel to each other with a specified spacing therebetween; and a respective dielectric strip which is disposed between the corresponding pair of conductors;

one of the conductors having a plane mounting surface which is entirely in contact with the substrate; and the pair of conductors defining an end surface which is vertical with respect to a direction in which an electromagnetic wave is propagated in the dielectric strip, an end of the dielectric strip being exposed at the end surface; and the exposed end of the dielectric strip of each of the devices being in contact with an exposed end of a respective dielectric strip of an adjacent one of said devices.

12. A high-frequency integrated circuit as claimed in claim 11, wherein the exposed end of the dielectric strip has a projection which is protruded from the end surface of the conductors.

13. A high-frequency integrated circuit as claimed in claim 11, wherein the exposed end of the dielectric strip has a recess which is retracted from the end surface of the conductors.

14. A high-frequency integrated circuit as claimed in claim 11, wherein at least one of the devices with a nonradiative dielectric waveguide is an oscillator.

15. A high-frequency integrated circuit as claimed in claim 11, wherein at least one of the devices with a nonradiative dielectric waveguide is a circulator.

16. A high-frequency integrated circuit as claimed in claim 11, wherein at least one of the devices with a nonradiative dielectric waveguide is a coupler which further has another dielectric strip which is also disposed between the pair of conductors and is coupled to said first-mentioned dielectric strip.

17. A high-frequency integrated circuit as claimed in claim 11, wherein at least one of the devices with a nonradiative dielectric waveguide is a nonreflective terminal.

18. A high-frequency integrated circuit as claimed in claim 11, wherein at least one of the devices with a nonradiative dielectric waveguide is a mixer.

19. A high-frequency integrated circuit as claimed in claim 11, wherein each of the devices with a nonradiative dielectric waveguide further comprises a filling material with a low dielectric constant between the pair of conductors.

20. A high-frequency integrated circuit as claimed in claim 11, further comprising an antenna provided to the substrate.

* * * * *